United States Patent [19]
Kos

[11] Patent Number: 5,255,797
[45] Date of Patent: Oct. 26, 1993

[54] WAFER CARRIER WITH WAFER RETAINING CUSHIONS

[75] Inventor: Robert D. Kos, Victoria, Minn.

[73] Assignee: Fluoroware, Inc., Chaska, Minn.

[21] Appl. No.: 842,225

[22] Filed: Feb. 26, 1992

[51] Int. Cl.⁵ .......................... B65D 85/48; H77F 7/00
[52] U.S. Cl. ....................................... 211/41; 206/334; 206/454
[58] Field of Search .................. 211/41; 206/454, 334, 206/586, 445, 444

[56] References Cited

U.S. PATENT DOCUMENTS

| | | | |
|---|---|---|---|
| 4,043,451 | 8/1977 | Johnson | 206/334 |
| 4,061,228 | 12/1977 | Johnson | 206/334 |
| 4,129,211 | 12/1978 | Clement et al. | 206/213 |
| 4,171,740 | 10/1979 | Clement et al. | 206/213 |
| 4,248,346 | 2/1981 | Johnson | 206/334 |
| 4,418,820 | 12/1983 | Nagle et al. | 211/41 X |
| 4,450,960 | 5/1984 | Johnson | 206/334 |
| 4,520,925 | 6/1985 | Johnson | 206/334 |
| 4,557,382 | 12/1985 | Johnson | 206/444 |
| 4,718,549 | 1/1988 | Rissotti et al. | 206/334 |
| 4,793,488 | 12/1988 | Mortensen | 206/454 |
| 4,817,799 | 4/1989 | Gregerson et al. | 206/445 |
| 4,858,764 | 8/1989 | Domokos | 211/41 X |
| 4,949,848 | 8/1990 | Kos | 211/41 |
| 4,966,284 | 10/1990 | Gregerson et al. | 206/444 |
| 5,025,926 | 6/1991 | Gregerson et al. | 206/444 |

Primary Examiner—Robert W. Gibson, Jr.
Attorney, Agent, or Firm—Palmatier, Sjoquist & Helget

[57] ABSTRACT

A wafer carrier for circular semiconductor wafers and having slotted sidewalls; cushioning fingers protruding upwardly and obliquely inwardly through the slots in the sidewalls and engaging the wafers and directing pressure against the wafers in a slightly downwardly direction, toward the center of the wafer and toward the lower portion of the sidewall across from the finger applying pressure; the fingers located immediately adjacent above the horizontal centerline of the wafer; and a latch is provided for retaining the fingers against the wafers, but permitting the fingers to be swung outwardly through the slotted sidewalls for releasing the wafers during removal and insertion of the wafers.

13 Claims, 3 Drawing Sheets

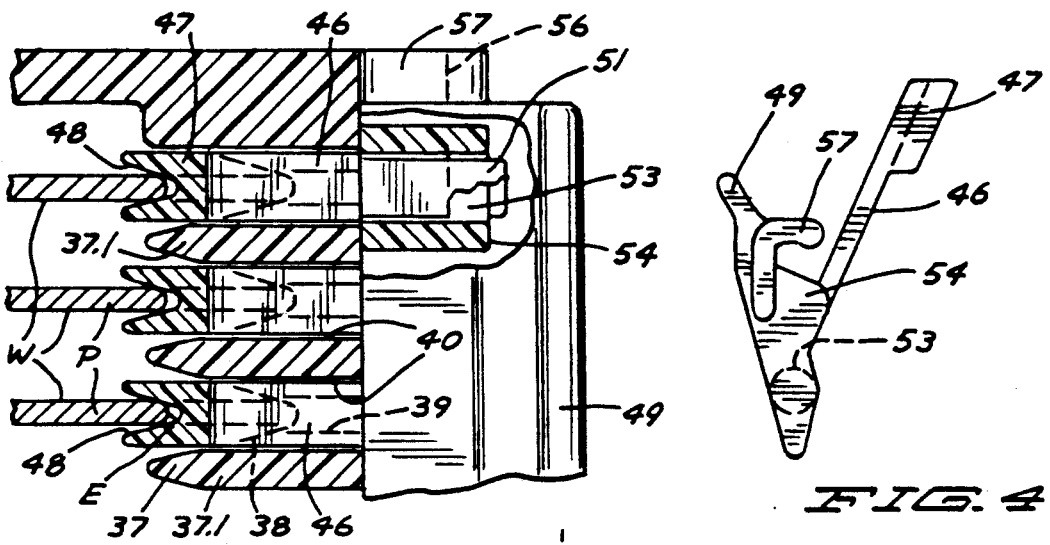
FIG. 3
FIG. 4
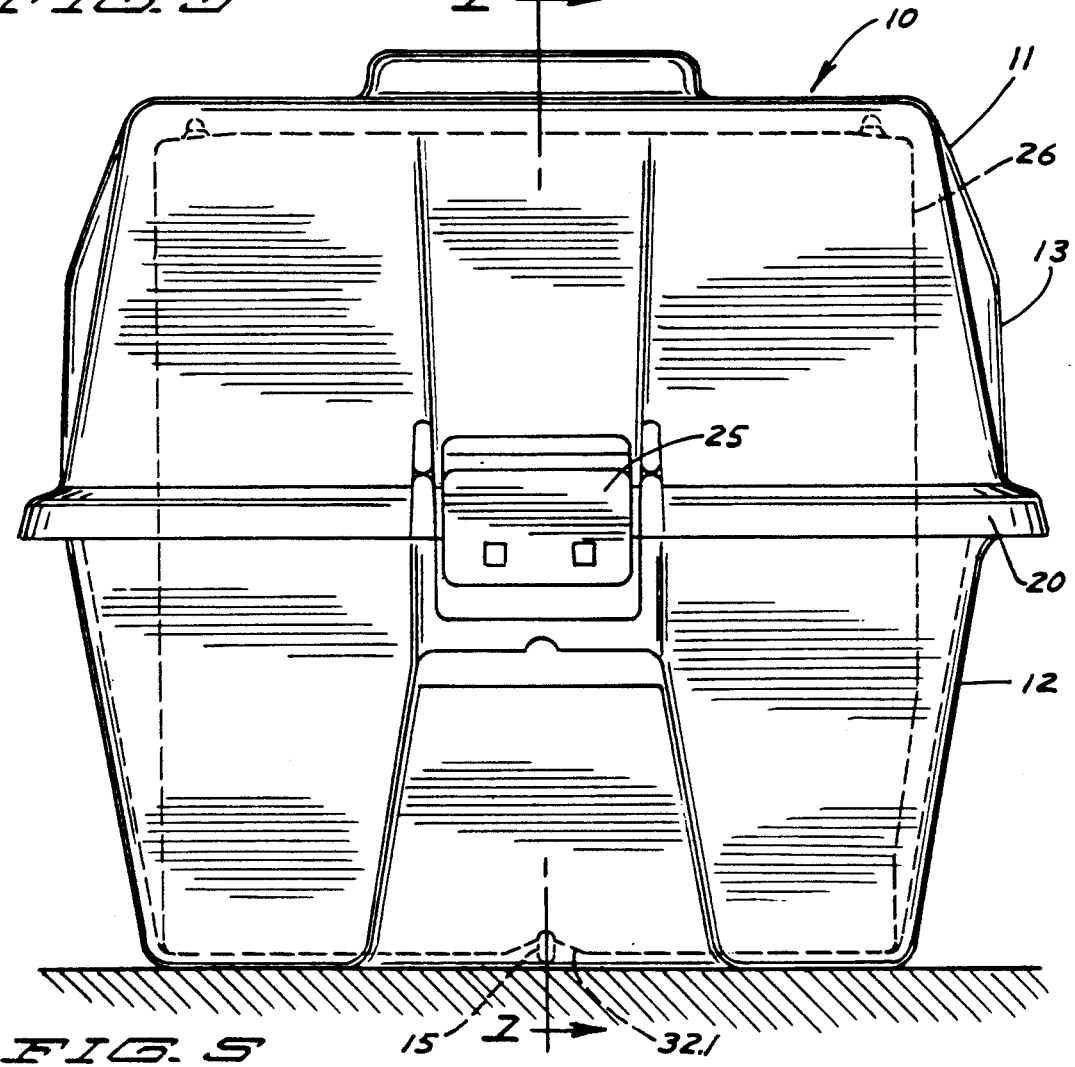
FIG. 5

WAFER CARRIER WITH WAFER RETAINING CUSHIONS

This invention relates to a container for storing semiconductor wafers and to the method of retaining such wafers in the container and against movement therein.

BACKGROUND OF THE INVENTION

During the processing of semiconductor wafers, the wafers may be processed through one or a number of process steps, and then the wafers are stored, and in some instances transported, prior to being processed through additional steps. During the storage and transporting of such wafers, the wafers are stored in wafer carriers wherein the wafers are separated from each other and the wafer carrier, with the wafers stored therein, is confined in a closed container. A number of cushioning devices have been used as to minimize undesired movement of the wafers in the carrier and outside container during the storage and transport.

Such previous cushioning devices have not been altogether satisfactory because certain such cushioning devices cause the generation of particles in their ordinary use, causing particulate contamination of the wafer; and other of the cushioning devices have been somewhat difficult to use because alignment between the cushioning devices and the individual wafers in the carrier is difficult. Oftentimes, the alignment must be carried out without being able to see the exact relationship between the edges of the wafers and the cushions which are to engage the wafers.

SUMMARY OF THE INVENTION

An object of the invention is to provide new and improved cushioning of wafers during their storage and transport by engaging the wafers at a location immediately adjacent but slightly above the horizontal diameter of the circular wafers, with a cushioning device which applies retaining pressure onto the edges of the wafers.

Another object of the invention is to provide an improved seal and latching arrangement between the bottom and cover of the container in which the wafer carrier and wafers are stored.

A feature of the invention is the provision of cushioning devices mounted on the sidewalls of the carrier and having cushioning fingers which extend through slots in the sidewall of the carrier to engage the edge portions of the wafers as the edge portions diverge in an upward direction away from the sidewall of the carrier. The intermediate portion of the sidewall is opposite the horizontal diameters through the circular wafers, and the cushions extend through the slots or openings in the upper portions of the sidewall, but immediately adjacent the intermediate portion of the sidewall.

Another feature of the invention is the method of retaining such wafers in a wafer carrier by applying retaining pressure onto the edge portions of the wafers at locations above and adjacent the horizontal diameters of the upright wafers and adjacent the sidewalls of the carrier which confines the wafers.

Still another feature of the invention is the provision of a wafer carrier with cushioning devices in the sidewalls thereof for engaging the edges of the wafers, and a container for enclosing the wafer carrier and having releasable latches retaining the cover and bottom portions of the container together.

BRIEF DESCRIPTION OF THE DRAWINGS

FIG. 3 is an enlarged detail section view taken approximately at 3—3 of FIG. 1.

FIG. 4 is an end elevation view of the cushioning device.

FIG. 5 is a side elevation view of the container, and showing the outline of the wafer carrier, shown in dotted lines.

DETAILED SPECIFICATION

Figure 1:
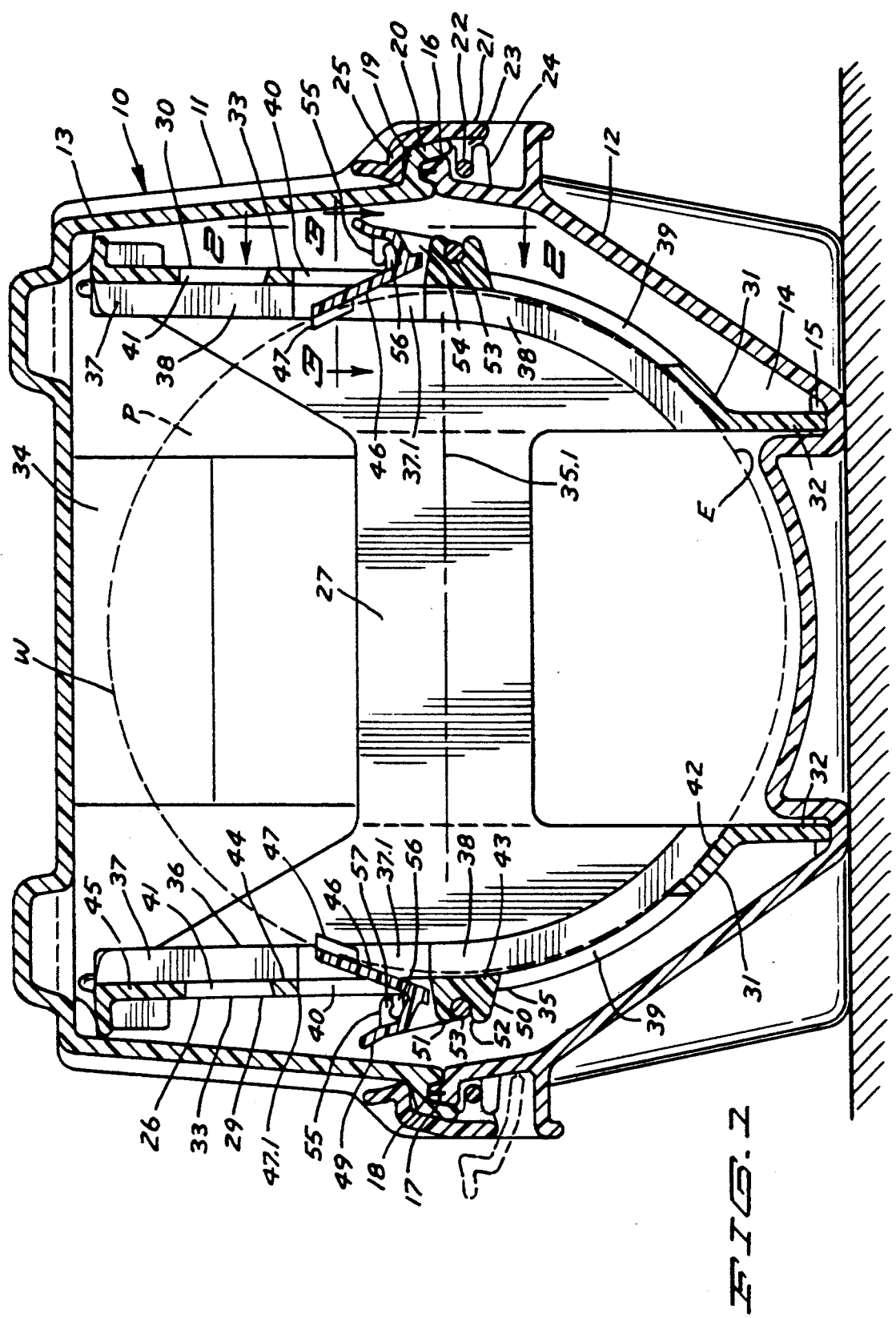
FIG. 1 is an enlarged detail section view of the assembled wafer carrier and container, with the location of the wafers indicated by the dotted lines, taken approximately at 1—1 of FIG. 5.

One form of the invention is shown in the drawings and is described herein. A shipping package, indicated in general by numeral 10, includes an enclosing container 11 having a box bottom 12 and a cover 13.

The box bottom defines a pair of elongate recesses 14, and in the bottom of each of the recesses is a positioning lug 15. The box bottom also has a rim portion 16 extending entirely around the top periphery of the box bottom 12; and the rim portion has a groove 17 therein receiving a seal 18 or gasket.

The cover 13 has an outturned rim portion 19 with a depending flange 20 embracing the rim portion 16 of the box bottom and sealing against the gasket or seal 18. A latch 21 has mounting pins 22 formed integrally thereof and captured within sockets 23 of the mounting posts 24 on the box bottom. The latch 21 forms a keeper portion 25 which clamps against the rim portion 19 of the cover for holding the cover 13 onto the box bottom. The latch 21 may be swung downwardly to release the cover.

A wafer carrier, indicated in general by numeral 26, is confined within the container 11 and is adapted to store a multiplicity of semiconductor wafers W. The wafer carrier 26 has end walls 27 and 28, and sidewalls 29 and 30, which are substantially identical to each other, but mirror images of each other. The sidewalls 29 and 30 are formed integrally with the end walls 27, 28 and the entire carrier 26 is molded of plastic. The particular plastic may be selected from a wide variety of materials, and the wafer carrier may be formed of such materials as polypropylene, high density polyethylene, various fluoropolymers such as perfluoroalkoxy, oftentimes known by its popular trademark Teflon, and of other plastic materials.

The sidewalls 29, 30 have wafer supporting lower portions 31 which may be curved to correspond to the curvature of the peripheral portions P of wafers W. The sidewalls of the wafer carrier also define supporting feet 32 which protrude downwardly into the recesses 14 of the box bottom 12, and have notches 32.1 which receive the positioning lugs 15.

The sidewalls 29 and 30 also have upright upper portions 33 spaced from each other to define the open top 34 of the wafer carrier through which the wafers W may be inserted and removed from the wafer carrier.

Sidewalls 29, 30 also have intermediate portions 35 located between the lower portions 31 and the upper portions 33, and the intermediate portions 35 are located approximately opposite a horizontal diameter 35.1 of the wafers W carried in the carrier.

Each of the sidewalls 29, 30 also has an inner portion 36 defining a multiplicity of spaced ribs 37 extending through the lower, upper, and intermediate portions 31, 33, 35, and spaced from each other to define a multiplicity of grooves 38 which receive the peripheral portions P of the wafers W. The ribs or spacers 37 maintain the wafers W in spaced relation with each other.

Figure 2:
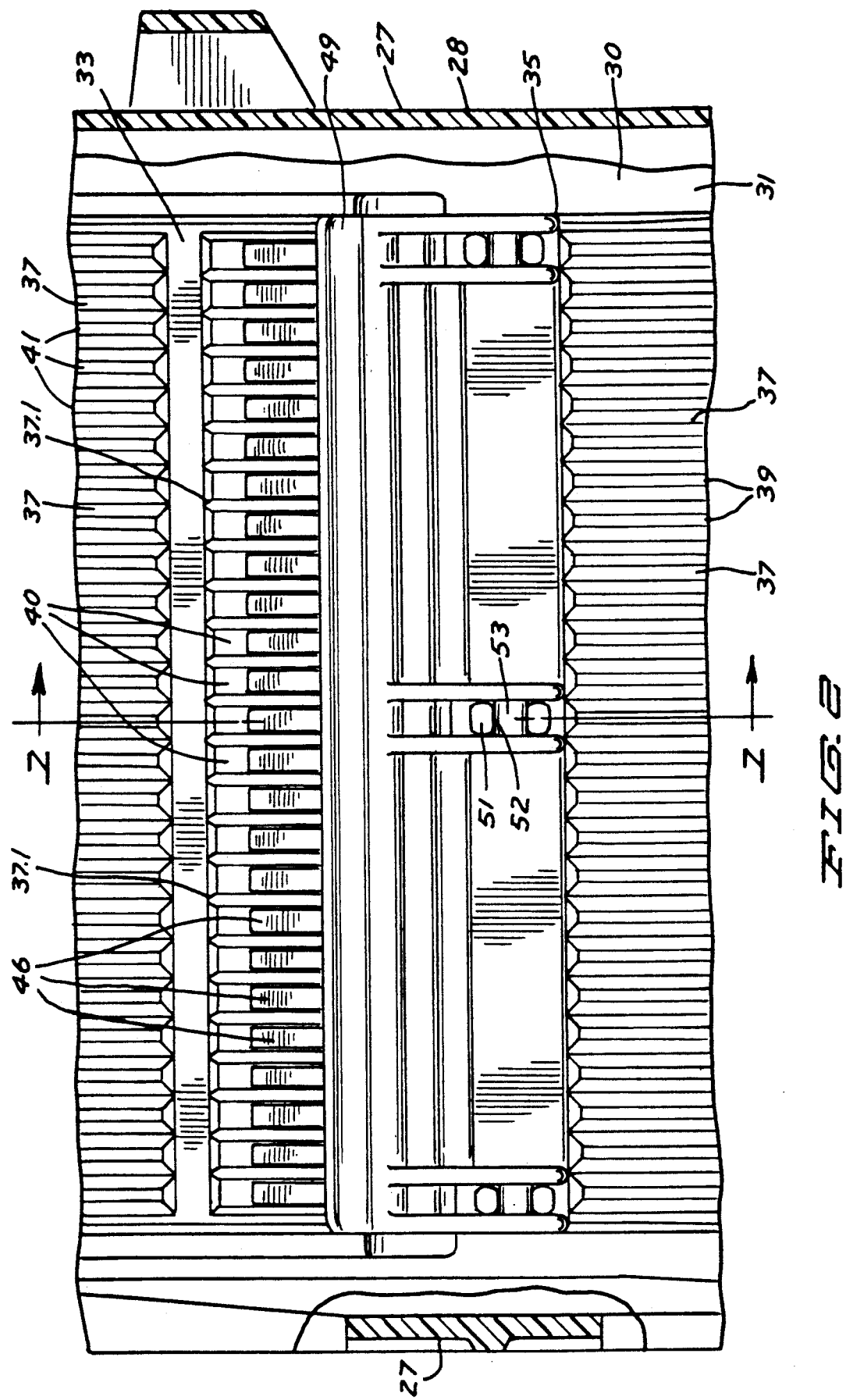
FIG. 2 is an enlarged detail elevation view of the wafer carrier and cushions, and showing portions of the carrier broken away and shown in detail, substantially as indicated at 2—2 of FIG. 1.

The sidewalls 29, 30 of the wafer carrier also have a multiplicity of slots 39, 40 and 41 therein. The slots 39 are in the lower portions 31 of the sidewalls and open into the grooves 38 between the spacing ribs 37; and the slots 41 are located in the upper portions 33 of the sidewalls and also open into the grooves 38 between the spacers or ribs 37. The slots 39 and 40 in the lower and upper portions of the sidewall are known as wash slots, which allow ready access to flow of rinsing fluids in the processing of wafers, as is well known to persons of skill in this art. The slots 40 are also located in the upper portions of the sidewalls 29, 30, and are immediately adjacent the intermediate portions 35 of the sidewalls. The slots 40 are wider, and therefore larger, than the slots 39, 41. Because the slots 40 are considerably wider than slots 39 and 41, the spacer ribs 37 are narrower, or have a reduced thickess as at 37.1, adjacent the slots 40, as seen in FIGS. 2 and 3.

It will be recognized that the sidewalls 29, 30 also include panel portions 42 below the slots 39 for supporting the wafers W at their outer edge portions E; panel portions 43 at the intermediate portions of the sidewalls for engaging the edge portions E of the wafers at the horizontal diameter or centerline 36 thereof; and panel portions 44, 45 in the upper portions 33 of the sidewalls for guiding the wafers during insertion and removal and for rigidifying the sidewalls at opposite ends of the upper slots 41.

A multiplicity of resiliently flexible cushions or cushioning fingers 46 are located in the slots 40 and the adjacent portions of grooves 38, and extend between the outer portions 47.1 of the sidewalls 29, 30, and the inner portions 36 thereof. The cushioning fingers 46, which extend generally upwardly and obliquely inwardly relative to the upper portions 33 of the sidewalls, have inner end portions 47 which have V-shaped grooves 48 therein to receive the edge portions E of the wafers in order to apply pressure against the edge portion of the wafer for retaining the wafer in stationary position within the wafer carrier 30.

Each of the slots 40 has a cushioning finger extending obliquely therethrough, and the fingers 46 also extend into the adjacent widened portions of grooves 38 adjacent the portions 37.1 of the ribs or spacers 37. It should be recognized that the cushioning fingers 46 are oriented substantially along a tangent of the periphery of the wafer W at the point of contact between the finger and the wafer, and that the fingers 46 apply pressure against the edge portions E of the wafers at a location slightly above the horizontal diameter of the wafer and in a direction toward the central portion or center of the wafer and toward the lower portion 31 of the opposite sidewall, to urge the wafer against the lower portion 31 of both sidewalls 29, 30.

All of the cushioning fingers 46 are formed integrally of a mounting member or frame bar 49 which extends along the entire length of the wafer carrier as illustrated in FIG. 2 and traverses, at the outer portion 47.1 of the sidewalls, all of the slots 40 so that the cushioning fingers 46 are properly located in the slots 40.

A hinging connection 50 is provided between the frame bar 49 and the panel portion 43 at the intermediate portion 35 of each of the sidewalls, and the hinging connections 50 include slotted posts 51 protruding outwardly from the panel portions 43 and defining hinge sockets 52 receiving hinge pins 53 which extend between pairs of bracket bars 54 formed integrally of the frame bar 49.

The frame bars 49 may be manually manipulated after the carrier is removed from the container 11 as to tilt the cushioning fingers 46 out of the grooves 38 and slots 40 to thereby relieve the pressure being applied onto the edges of the wafers and allow the wafers to be removed from the carrier.

Latching devices 55 interconnect the sidewalls of the carrier with the frame bar 49, and such latching devices include stationary lugs 56 on the ends of the carrier and latching keepers 57 formed integrally with the frame bar 49.

In the use and operation of the invention, the carrier 30 will be filled with wafers carriers, one in each slot 38, while the carrier is outside of the container 11. In order to insert the wafers into the carrier, the cushioning fingers 46 must be swung outwardly through the slots 40 so as to clear the grooves 38; and in order to swing the cushioning fingers outwardly, the frame bars 49 will be manually manipulated so as to tilt the frame bar and cushioning fingers about the pivot pins 53.

When the wafers have been loaded into the carrier, the frame bars 49 will be manually manipulated again as to tilt or swing the cushioning fingers 46 inwardly through the slots 40 and into the grooves 38 to engage the adjacent edge portions E of the wafers and apply retaining pressure onto the wafers. At this position, latching devices 55 retain the fingers against the wafers. It is significant that the cushioning fingers 46 extend through the sidewall at slots 40 in the upper portion of the sidewall, immediately adjacent the intermediate portion 35 thereof, and at a location adjacent the horizontal axis or diameter 36 of the wafers. At the location of the end portions 47 of the cushioning fingers, the edge portions of the wafers are diverging from the adjacent portions of the sidewalls, and the edge portions are extending obliquely through the grooves 38. As the end portions 47 of the cushioning fingers engage the edge portions of the wafers, pressure is applied by each finger toward the center or central portions of the wafer and toward the lower portion 31 of the opposite sidewall, and in a direction substantially normal to the wafer's tangent at the point of contact. As a result, as the cushioning fingers engage the wafers, there will be no movement of either the wafers or the wafer fingers in a direction along the periphery or edge portion of the wafers and accordingly, there will be no particles generated due to this engagement between the edge portions of the wafer and the end portions 47 of the cushioning fingers.

The resilient flexibility of the cushioning fingers 46 will accommodate slight variations in the shapes and sizes of the wafers.

The same widened slots 40 which accommodate the cushioning fingers and the movement thereof inwardly toward and outwardly away from the wafer, also provide for flow of rinsing fluids when the same carrier may be used during rinsing and processing of the wafers.

When the wafers are being stored in the carrier and the cushioning fingers apply retaining pressure against the edges of the wafers, the latching devices 55 retain the cushioning fingers in proper position against the edge portions of the wafers as to maintain the retaining pressure on the wafers.

When the wafer carrier is to be taken out of storage for further use or processing of the wafers, the wafer carrier will be simply removed from the container 11 by lifting off the cover, and then the wafer carrier may be lifted out of the box bottom. The frame bars 49 may be easily manually manipulated to release the latching device and to swing the cushioning fingers out of the slots or openings 40 and out of the grooves 38. The wafers may then be readily removed from the wafer carrier by sliding them out through the open top 34.

It will be seen that the present invention also includes the method of retaining circular semiconductor wafers in a wafer carrier which supports each upright wafer in grooves of the opposite sidewalls, and the method includes extending cushioning fingers through the slots in the sidewall and engaging and apply retaining pressure onto the edge portions of the circular wafers at locations above and adjacent the horizontal diameters of the upright wafers in the carrier and adjacent each of the sidewalls. The retaining pressure applied by the cushioning fingers is directed toward the central portions of the wafers; and the retaining pressure is relieved by retracting the cushioning fingers through the slots in the sidewalls of the carrier.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. A wafer carrier for circular semiconductor wafers being stored and transported comprising,
    sidewalls comprising wafer spacing means defining grooves in which the peripheral portions of the wafers are received, the sidewalls comprising lower portions supporting the wafers and upright upper portions accommodating insertion and removal of the wafers, and the sidewalls also comprising intermediate portions between said lower and upper portions and adjacent the horizontal diameters of the wafers, the sidewalls also comprising slots through said upper portions thereof and into said grooves adjacent the intermediate portions of the sidewalls, the edge portions of the peripheral portions of the wafers diverging from the sidewalls and out of the grooves adjacent said slots,
    a multiplicity of wafer cushioning fingers extending inwardly through said slots and adjacent said intermediate portions of the sidewalls and comprising end portions engaging the diverging edge portions of the wafers to retain the wafers against movement relative to the sidewalls, and
    mounting means carrying the cushioning fingers and being tiltably mounted on the sidewalls for swinging the fingers away from the wafers and outwardly through the slots for releasing the wafers for removal of the wafers from the wafer carrier.

2. A wafer carrier according to claim 1 wherein the end portions of said fingers are grooved to receive the edge portions of the wafers therein.

3. A wafer carrier according to claim 1 wherein said fingers are resiliently flexible for substantially uniformly applying pressure against the edge portions of the wafers.

4. A wafer carrier according to claim 1 wherein said sidewalls comprise outer portions and inner portions, the mounting means comprising frame bars extending along the outer portion of the sidewalls and being formed integrally of said fingers, the sidewalls and frame bars having hinging pin and socket connections accommodating the tilting of the frame bars and fingers about horizontal axes extending along the sidewalls.

5. A wafer carrier according to claim 1 wherein a two-part latching means comprises cooperating latching parts on the sidewalls and one said mounting means for releasably retaining the mounting means against tilting while the cushioning fingers engage the wafers.

6. A wafer carrier according to claim 1 and said cushioning fingers extending upwardly and obliquely of the upper portion of the sidewall.

7. A wafer carrier according to claim 1 and the mounting means urging the fingers and the end portions thereof against the edge portions of the wafers in a direction toward the center portions of the wafers.

8. A wafer carrier for circular semiconductor wafers being stored or transported comprising,
    sidewalls comprising wafer spacing means defining grooves in which the peripheral portions of the wafers are received, the sidewalls comprising lower portions supporting the wafers and upright upper portions accommodating insertion and removal of the wafers, and the sidewalls also comprising intermediate portions between said lower and upper portions and adjacent the horizontal diameters of the wafers, the sidewalls also comprising openings through said upper portions thereof and adjacent the intermediate portions of the sidewalls, the edge portions of the peripheral portions of the wafers diverging from the sidewalls adjacent said openings,
    a plurality of wafer-engaging cushions extending inwardly through said openings and comprising end portions engaging the diverging edge portions of the wafers to retain the wafers against movement relative to the sidewalls, and
    said cushions also comprising mounting means tiltably mounted on the sidewalls for swinging the cushions away from the wafers and outwardly through the openings to release the wafers for removal from the wafer carrier.

9. A wafer carrier according to claim 8 wherein the cushions direct pressure against the circular wafers in a direction to urge the wafers toward said lower portions of the sidewalls.

10. The method of retaining circular semiconductor wafers in a wafer carrier which supports the upright wafers in grooves of the opposite sidewalls, comprising
    extending cushioning fingers through slots in the sidewalls and engaging and applying retaining pressure onto the edge portions of the circular wafers at locations above and adjacent the horizontal diameters of the upright wafers and adjacent the sidewalls.

11. The method of retaining circular semiconductor wafers according to claim 10 wherein the retaining pressure is directed toward the central portions of the circular wafers.

12. The method of retaining circular semiconductor wafers according to claim 10 wherein the retaining pressure is relieved by retracting the cushioning fingers through the slots in the sidewalls.

13. The method of retaining circular semiconductor wafers according to claim 10 wherein the retaining pressure is directed by said fingers onto the wafers and in directions toward portions of both sidewalls below the horizontal diameters of the wafers.

* * * * *